(12) United States Patent
Kleemann

(10) Patent No.: US 7,262,915 B2
(45) Date of Patent: Aug. 28, 2007

(54) BLAZED DIFFRACTIVE OPTICAL ELEMENT AND PROJECTION OBJECTIVE FOR A MICROLITHOGRAPHIC PROJECTION EXPOSURE APPARATUS

(75) Inventor: Bernd Kleemann, Aalen (DE)

(73) Assignee: Carl Zeiss AG, Oberkochen (DE)

( * ) Notice: Subject to any disclaimer, the term of this patent is extended or adjusted under 35 U.S.C. 154(b) by 0 days.

(21) Appl. No.: 11/280,313

(22) Filed: Nov. 17, 2005

(65) Prior Publication Data

US 2006/0132920 A1 Jun. 22, 2006

Related U.S. Application Data

(63) Continuation of application No. PCT/EP2004/004636, filed on May 3, 2004.

(30) Foreign Application Priority Data

May 17, 2003 (DE) ................ 103 22 239

(51) Int. Cl.
*G02B 5/18* (2006.01)
(52) U.S. Cl. .............. 359/569; 359/565; 359/575
(58) Field of Classification Search ................ 359/569, 359/565, 571, 575, 576
See application file for complete search history.

(56) References Cited

U.S. PATENT DOCUMENTS 5,561,558 A * 10/1996 Shiono et al. ............ 359/569
6,122,104 A 9/2000 Nakai
6,166,854 A * 12/2000 Katsuma ................ 359/569
2002/0003661 A1 1/2002 Nakai
2002/0034011 A1 3/2002 Nakai
2002/0196547 A1 12/2002 Kleemann et al.

FOREIGN PATENT DOCUMENTS

| EP | 0 902 304 A2 | 3/1999 |
|---|---|---|
| EP | 0 965 864 A2 | 12/1999 |
| EP | 1 022 589 A1 | 7/2000 |
| EP | 1 072 906 A2 | 1/2001 |
| JP | 01282501 A | 11/1989 |
| JP | 11194207 A | 7/1999 |
| WO | WO 2004/025335 A1 | 3/2004 |

OTHER PUBLICATIONS

Mane-Si Laure Lee et al., Imaging With Blazed- Binary Diffractive Elements, In: Philippe Lalanne (Ed.) Physics, Theory, and Applications of Periodic Structures in Optics, Proceedings of SPIE 2001, vol. 4438 pp. 62-68.

Mane-Si Laure Lee, Philippe .Lalanne, Pierre Chavel, Blazed-Binary Diffractive Elements With Periods Much Larger Than the Wavelength, J. Opt. Soc. Am. A, Jul. 2000, vol. 17, pp. 1250-1255.

(Continued)

*Primary Examiner*—Fayez G. Assaf
(74) *Attorney, Agent, or Firm*—Sughrue Mion, PLLC

(57) ABSTRACT

A blazed diffractive optical element has a support and a plurality of blazed diffraction structures. The diffraction structures are applied on the support and are spaced apart by a locally varying grating constant. In a first region, the diffraction structures have an at least approximately ramp-shaped profile. In a second region, the diffraction structures are binary blazed by splitting them into substructures that may have the shape of pillars or bars.

10 Claims, 2 Drawing Sheets

OTHER PUBLICATIONS

Mane-Si Laure Lee et al., Wide-Field-Angle Behavior of Blazed-Binary Gratings in the Resonance Domain, Optics Letters, Dec. 1, 2000 vol. 25, pp. 1690-1692.

Philippe Lalanne, Waveguiding in Blazed-Binary Diffractive Elements, J. Opt. Soc. Am. A, Oct. 1999, vol. 16 No. 10, pp. 2517-2520.

Philippe Lalanne et al., "Design and Fabrication of Blazed Binary Diffractive Elements With Sampling Periods Smaller Than the Structural Cutoff", J. Opt. Soc. Am., May 1999, vol. 16, No. 5, pp. 1143-1156.

Philippe Lalanne, et al., "Blazed Binary Subwavelength Gratings With Efficiencies Larger Than Those of Conventional Echelette Gratings," Optic Letters, Jul. 15, 1998, vol. 23, No. 14, pp. 1081-1083.

Simion Astilean et al., High-Efficiency Subwavelength Diffractive Element Patterned in a High-Refractive-Index Material for 633NM, Optical Letters, Apr. 1, 1998 vol. 23, No. 7, pp. 552-554.

Eero Noponen et al., Electromagnetic Theory and Design of Diffractive- Lens Arrays, J. Opt. Soc. Am. A, Mar. 1993, vol. 10, No. 3, pp. 434-443.

Yunlong Sheng et al., Analysis and Synthesis of Circular Diffractive Lens With Local Linear Grating Model and Rigorous Coupled-Wave Theory, J. Opt. Soc. Am A, Jul. 1997, vol. 14, No. 7, pp. 1562-1568.

Kasimir Blomstedt et al., Surface- Profile Optimization of Diffractive 1:1 Imaging Lenses, J. Opt. Soc. Am A, Mar. 2001, vol. 18, No. 3, pp. 512-525.

* cited by examiner

BLAZED DIFFRACTIVE OPTICAL ELEMENT AND PROJECTION OBJECTIVE FOR A MICROLITHOGRAPHIC PROJECTION EXPOSURE APPARATUS

CROSS-REFERENCE TO RELATED APPLICATIONS

This application is a continuation of International Application PCT/EP2004/004636, with an international filing date of May 3, 2004 and claiming priority of German Patent Application DE 103 22 239 filed May 17, 2003. The full disclosures of both earlier applications are incorporated herein by reference.

BACKGROUND OF THE INVENTION

1. Field of the Invention

The invention relates to a blazed diffractive optical element having a support and a plurality of blazed diffraction structures which are applied on the support and are spaced apart with locally varying grating constant. The invention also relates to a projection objective for a microlithographic projection exposure apparatus comprising such an optical element.

2. Description of Related Art

Diffractive optical elements with locally varying grating constants have found many applications in optics. Diffractive optical elements are used, for example, to generate wavefront profiles which cannot—or only with great difficulty—be achieved by refractive optical elements such as lenses. Fresnel lenses which make it possible to achieve extremely short focal lengths are also widely used. The use of diffractive optical elements to correct chromatic aberrations in optical systems, which are caused by the dispersive properties of the conventional lens materials with broadband light sources, has been proposed, for example, in EP 0 965 864 A2. It is also feasible to use diffractive optical elements for focusing, collimation and beam splitting of laser light in integrated optics, since diffractive optical elements can likewise be produced photolithographically.

The grating constant g in such diffractive optical elements, by which the diffraction structures are separated from one another, may locally vary continuously or sectionally in one or more directions. The grating constant g generally varies along the diameter in rotationally symmetric elements, and along the transverse and/or long sides in rectangular elements.

One important property of diffractive optical elements is the diffraction efficiency. This term denotes the fraction of the light incident on the diffractive optical element which contributes to a particular diffraction order. For many applications, it is desirable to have a diffraction efficiency which is constant over the entire surface of the diffractive optical element. Microlithographic projection exposure apparatus, in which diffractive optical elements must ensure a very homogeneous illumination of an illuminated field, are an example of this.

It has been found, however, that the diffraction efficiency of such diffractive optical elements decreases as the grating constants become smaller. This effect is further exacerbated by the fact that the regions with the smallest grating constants are often those which the light strikes at the largest angle of incidence, and this likewise has an unfavorable effect on the diffraction efficiency. Since the grating constant in the diffractive optical elements considered here is position-dependent, the diffraction efficiency also varies over the surface of the diffractive optical element. With grating constants which are very large compared to the operating wavelength of the element, the local changes in the diffraction efficiency are small. Yet when the element also comprises regions with diffraction constants which amount only to about five times the wavelength or less, this can lead to variations of up to 20% in the diffraction efficiency.

Various measures have been proposed in order to suppress these variations.

For example, it is known from US 2002/0196547, which corresponds to DE 101 23 230 A1, to reduce the high diffraction efficiency in regions with large grating constants and thereby adapt it to the lower diffraction efficiency of the regions with small grating constants. The reduction of the diffraction efficiency is achieved by a local reduction of the grating depth. A disadvantage with this, however, is that the total usable light energy transmitted or reflected by the element is thereby also reduced. This is disadvantageous, for example, in projection exposure apparatus which have a weak radiation source and/or which have a large image field to be illuminated.

On the other hand, in certain cases it may also be expedient to use diffractive optical elements with particularly large and deliberately adjustable variations in the diffraction efficiency. If the aforementioned known approach were to be applied in such a case, then the diffraction efficiency of the regions with an already low diffraction efficiency would be reduced further in order to amplify the variations.

SUMMARY OF THE INVENTION

It is therefore an object of the present invention to provide a diffractive optical element that makes it possible to achieve within wide limits arbitrary distributions of the diffraction efficiency, and in particular a constant diffraction efficiency, with low light losses.

According to one formulation of the invention, this object is achieved by a blazed diffractive optical element that has a support and a plurality of blazed diffraction structures. The diffraction structures are applied on the support and are spaced apart by a locally varying grating constant. In a first region, the diffraction structures have an at least approximately ramp-shaped profile. In a second region, the diffraction structures are binary blazed by splitting them into substructures that may have the shape of pillars or bars.

Such substructures are described, for example, in an article by P. Lalanne et al. entitled "*Design and fabrication of blazed binary diffractive elements with sampling periods smaller than the structural cutoff*", J. Opt. Soc. Am. A, Vol. 16, No 5, pages 1143 to 1156. It has been found that such binary blazed diffraction structures have a higher diffraction efficiency than conventionally blazed diffraction structures with ramp-shaped profiles or step-shaped profiles approximating ramps. The spatial profile of the diffraction efficiency can thus be deliberately influenced by combining the conventionally blazed diffraction structures, which are comparatively easy to produce, with the binary blazed diffraction structures in the same optical element. Unlike known approaches, however, the influence is achieved here by local increase rather than by local reduction of the diffraction efficiency. The diffractive optical elements according to the invention therefore have lower light losses than is the case with the known approaches.

The binary substructures furthermore have the advantage that the diffractive elements have a large angle acceptance. This means that the high diffraction efficiencies can be achieved even with significant deviations from the ideal blaze angle. Furthermore, the high diffraction efficiencies are achieved within a larger wavelength range than with conventional blaze structures. Another advantage is the greater-polarization independence of the binary blazed diffraction structures.

It is of course possible for a plurality of first regions with conventionally blazed diffraction structures and a plurality of second regions with binary blazed diffraction structures to be applied on the support in any desired arrangement. The arrangement will preferably be established from the standpoint that binary blazed diffraction structures are applied on the support only where the diffraction efficiency of conventionally blazed diffraction structures is insufficient.

The configuration, dimensions and production of binary blazed diffraction structures are known per se in the prior art. They are distinguished in that the usually pillar-shaped or bar-shaped substructures, from which they are constructed, have characteristic dimensions which are smaller than the wavelength for which the diffractive optical element is intended. Beyond the zeroth order, the substructures then generate no further diffraction orders which could take up energy. Diffraction efficiencies of 80% or more are therefore possible. If the spacings of the pillars or bars are less than a structure period, then the diffractive substructures can be regarded as homogeneous medium in which only one mode can propagate. The value of the structure period depends inter alia on the angle of incidence of the light and the geometry of the substructures.

The second region with the binary blazed diffraction structures may be the region with the smaller grating constants. This is advantageous because the higher diffraction efficiency of binary blazed diffraction structures then makes it possible to compensate for the effect that the diffraction efficiency locally decreases when the grating constant becomes smaller in diffractive optical elements with position-dependent grating constants. In this way, for example, it is possible to achieve an almost spatially constant diffraction efficiency for a particular diffraction order.

In order to avoid substantial discontinuities in the diffraction efficiency at the boundaries between the first region and the second region, an intermediate region having at least one binary blazed diffraction structure, which is designed so that the diffraction efficiency in the intermediate region is reduced relative to that of an optimal design, may be arranged between them. The diffraction efficiency may, for example, be adjusted so that it increases continuously from the relatively low diffraction efficiency of the conventionally blazed first region to the higher diffraction efficiency of the binary blazed second region. It is likewise possible to adjust the diffraction efficiency in the intermediate region so that it lies between that of the first region and that of the second region. The local detuning of the diffraction efficiency in the intermediate region may, for example, be generated by applying substructures of reduced height on the support there. Any phase change associated with the local detuning may need to be compensated for by other measures in the system.

BRIEF DESCRIPTION OF THE DRAWINGS

Various features and advantages of the present invention may be more readily understood with reference to the following detailed description taken in conjunction with the accompanying drawings, in which.

DETAILED DESCRIPTION OF THE INVENTION

Figure 1:
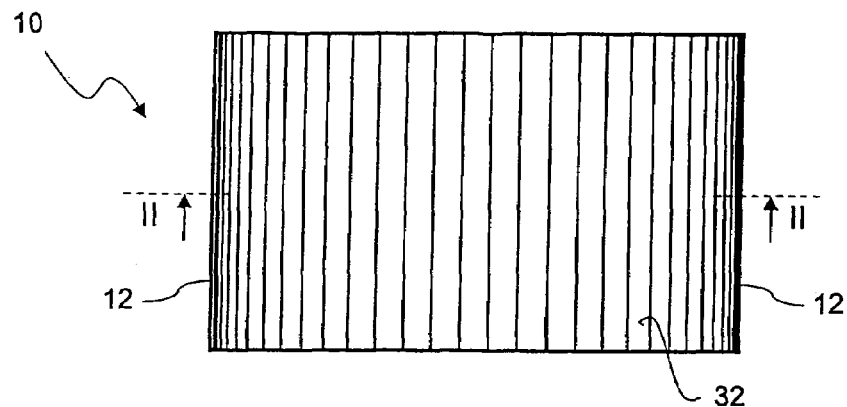
FIG. 1 shows a schematic representation in plan view, not true to scale, of a rectangular diffractive optical element designed as a linear grating.
Figure 2:
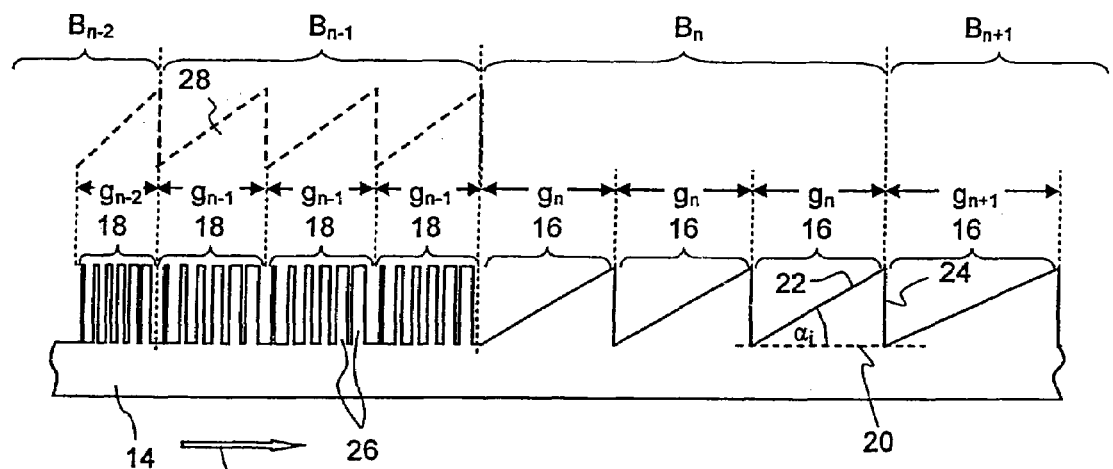
FIG. 2 shows an enlarged detail of a section along the line II-II through the diffractive optical element shown in FIG. 1.

A first exemplary embodiment of a diffractive optical element, denoted in its entirety by 10, is shown in FIG. 1 by a schematic representation in plan view, which is not true to scale, and in FIG. 2 as details in a section along the line II-II. The diffractive optical element 10 is designed as a rectangular linear blaze grating, the grating constant g of which decreases sectionally towards the transverse sides 12. FIG. 1 indicates the decrease in the grating constant by the vertical lines which become denser towards the transverse sides 12.

The diffractive optical element comprises a multiplicity of blazed diffraction structures 16 and 18 applied on a support 14, which are subdivided into a plurality of regions with respectively equal grating constants. The enlarged sectional representation of FIG. 2 represents in all four of these regions $B_{n-2}$, $B_{n-1}$, $B_n$ and $B_{+1}$, within which the grating constant $g_i$ is respectively constant. The grating constants $g_i$ decrease from right to left in the representation of FIG. 2, i.e. $g_{n-2} < g_{n-1} < g_n < g_{n+1}$.

In the regions $B_n$ and $B_{n+1}$ with the larger grating constants $g_n$ and $g_{n+1}$, the diffraction structures 16 are designed as conventional blaze structures with a ramp-shaped profile. Each ramp has a blaze edge 22 inlined by a blaze angle $\alpha_i$ relative to the base surface 20 of the diffractive optical element 10, which is established by the support 14, and a back edge 24 arranged perpendicularly to a base surface 20. The value of the blaze angle $\alpha_i$ is locally dependent in this exemplary embodiment, and decreases with increasing grating constants $g_i$.

In the regions $B_{n-1}$ and $B_{n-2}$ with the small grating constants $g_{n-1}$ and $g_{n-2}$, the diffraction structures 18 are binary blazed by being split into bar-shaped substructures 26. This means are each binary diffraction structure 18 in these two regions $B_{n-1}$ and $B_{n-2}$ consists of a group of substructures 26, which may respectively be thought of as a substitute for a conventional ramp-shaped diffraction grating 28, as indicated in FIG. 2 by ramp profiles 28 represented as dashes. Within a binary blazed diffraction structure 18, the width of the bar-shaped substructures 26 respectively increases in a direction indicated by 30, and the distance between the substructures 26 decreases in this direction 30, so that each group forming a diffraction structure 18 optically has a diffraction effect on incident light which is essentially comparable to that of a corresponding ramp-shaped diffraction structure 18 with an equal grating constant $g_i$.

Compared to such ramp-shaped diffraction structures 28, however, the binary blazed diffraction structures 18 have a higher diffraction efficiency. This compensates for a decrease in the diffraction efficiency which would occur in the conventionally blazed diffraction structures 18 because of their small grating constants. The diffractive optical element 10 therefore has a diffraction efficiency which is approximately constant over its surface 32. A prerequisite here is merely that the substructures 26 have characteristic dimensions which are smaller than the wavelength of the incident light.

The support 14 may, for example, consist of glass and the substructures 26 may, for example, consist of titanium oxide ($TiO_2$), the refractive index n of which is substantially higher than that of glass (n=1.5). In this way, it is possible to reduce the ratio of profile depth h to the width b of the substructures 26 (see FIG. 3).

Owing to the higher diffraction efficiency of the binary blazed diffraction structures 18 compared to the conventionally blazed diffraction structures 16, an abrupt change in the diffraction efficiency takes place at the boundary between the regions $B_{n-1}$ and $B_n$, and this may be undesirable in particular applications.

Figure 3:
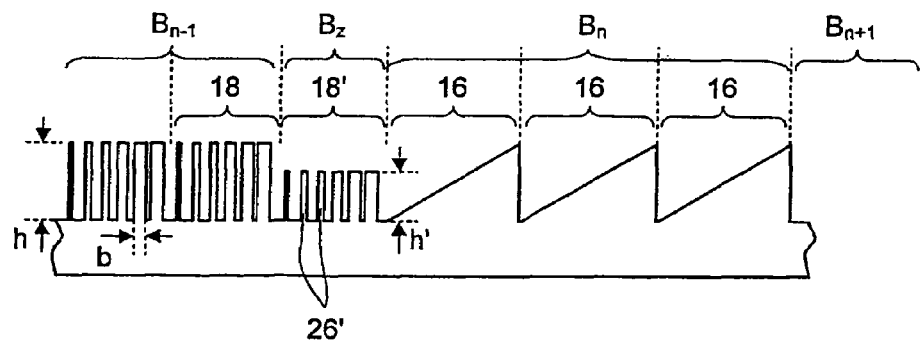
FIG. 3 shows a representation, corresponding to FIG. 2, of another diffractive optical element with locally reduced diffraction efficiency.

In order to achieve a less abrupt change in the diffraction efficiency along this boundary, a binary blazed intermediate region $B_z$ comprising one or more binary blazed diffraction structures 18' is provided between the regions $B_n$ and $B_{n-1}$ in the exemplary embodiment shown in FIG. 3. The diffraction structure 18' is designed so that the diffraction efficiency in the intermediate region $B_z$ lies between that in the region $B_n$ and that in the region $B_{n-1}$. This local reduction in the diffraction efficiency may, for example, be created by reducing the height h' of the substructures 26' for the diffraction structure 18' in the intermediate region $B_z$ relative to the height h in the neighboring binary blazed diffraction structures 18, as shown in FIG. 3. Another possible way of reducing the efficiency is to keep the height h of the substructures unchanged and instead to vary their spacings and widths. In this way, the detuning of the diffraction efficiency has a lesser effect on the phase of light passing through.

Figure 4:
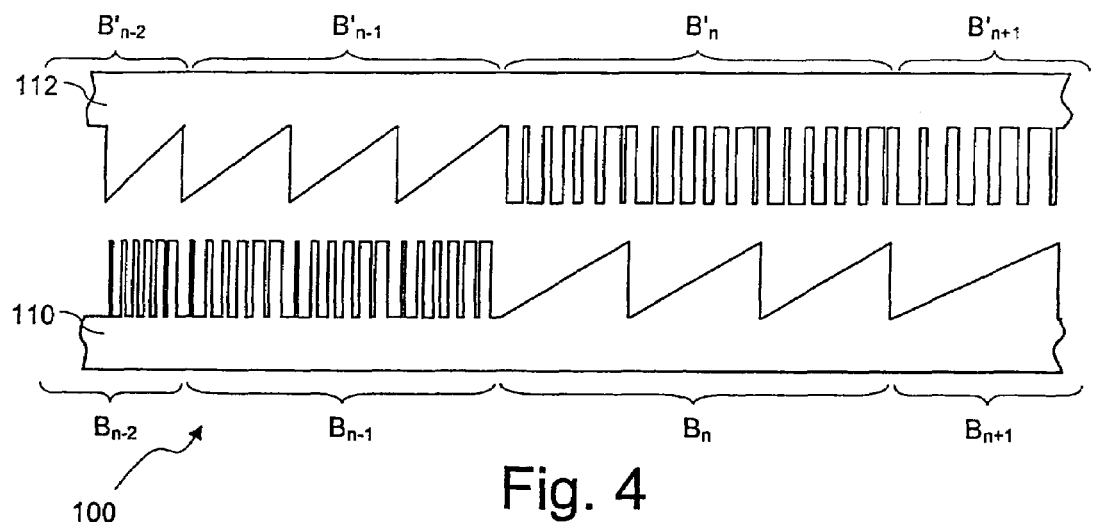
FIG. 4 shows a detail of a section through a diffractive optical element comprising two sub-elements arranged above one another, which are respectively constructed similarly as the diffractive optical element shown in FIGS. 1 and 2.

FIG. 4 shows another exemplary embodiment of a diffractive optical element, denoted overall by 100, as details in a sectional representation. The diffractive optical element 100 comprises a first sub-element 110 and a second sub-element 112, which are arranged above one another and mutually parallel. The first sub-element 110 is constructed like the diffractive optical element 10 shown in FIGS. 1 and 2. The second sub-element 112 corresponds substantially to the diffractive optical element 10 but, unlike it, the regions $B'_n$ and $B'_{n+1}$ with large grating constants are binary blazed instead of the regions $B'_{n-1}$ and $B'_{n-2}$ with small grating constants. Instead of the flat support, it is also possible to use curved supports, for example lens surfaces. The two sub-elements 110 and 112 may furthermore consist of different materials, or have supports which consist of a different material than the diffraction structures. Furthermore, unlike the exemplary embodiment shown in FIG. 4, the two sub-elements 110 and 112 also differ by the profile depth. Diffractive optical elements with sub-elements which are arranged above one another, but are only conventionally blazed, are known per se from EP 0 965 864 A2.

Figure 5:
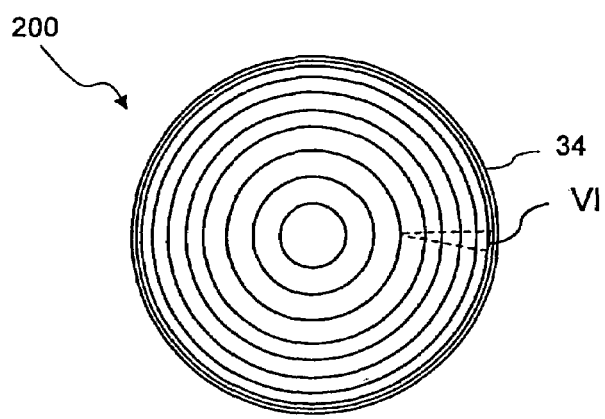
FIG. 5 shows a schematic representation in plan view, not true to scale, of a diffractive optical element designed as a Fresnel lens.

In a schematic representation which is not true to scale, FIG. 5 shows another exemplary embodiment, denoted by 200, of a diffractive optical element in plan view. The diffractive optical element 200 is a Fresnel lens, in which the grating constant g decreases with increasing distance from the middle of the element 200. This is indicated in FIG. 5 by the circle lines becoming denser outwards. The Fresnel lens 200 may, for example, be intended for installation in a projection objective of a microlithographic projection exposure apparatus.

Figure 6:
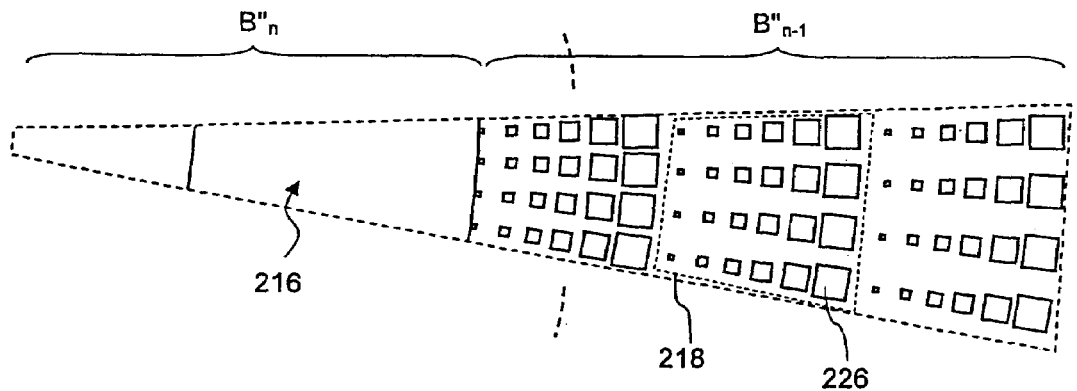
FIG. 6 shows an enlarged detail VI of the Fresnel lens shown in FIG. 5.

The detail VI of the plan view in FIG. 5 is represented on an enlarged scale in FIG. 6. It shows a region $B''_{n-1}$, lying close to the circumference 34, where the diffraction structures 218 are binary blazed. Here, the substructures 226 are designed not as bars but as pillars with a square base surface. In the neighboring region $B''_n$ towards the middle of the element 200, the diffraction structures 216 again have the conventional ramp shape.

The above description of the preferred embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

The invention claimed is:

1. A blazed diffractive optical element, comprising:
   a) a support and
   b) a plurality of blazed diffraction structures which are applied on the support and are spaced apart by a locally varying grating constant,
      have an at least approximately ramp-shaped profile in a first region, and
      are binary blazed in a second region by splitting them into substructures.

2. The optical element of claim 1, wherein the substructures are pillar-shaped or bar-shaped.

3. The optical element of claim 1, wherein the diffraction structures have a smaller grating constant in the second region than in the first region.

4. The optical element of claim 1, comprising an intermediate region arranged between the first region and the second region, said intermediate region comprising at least one binary blazed diffraction structure that is configured such that a diffraction efficiency in the intermediate region lies between a diffraction efficiency in the first region and a diffraction efficiency in the second region.

5. A projection objective for a microlithographic projection exposure apparatus, comprising the optical element of claim 1.

6. A blazed diffractive optical element, comprising:
   a support, and
   a plurality of blazed diffraction structures which are applied on the support and are spaced apart by a locally varying grating constant,
   wherein the plurality of blazed diffraction structures comprise a first group of diffraction structures in a first region and a second group of diffraction structures in a second region,
   each diffraction structure of the first group of diffraction structures has an at least approximately ramp-shaped profile, and
   each diffraction structure of the second group of diffraction structures is binary blazed by splitting the diffraction structure into a plurality of substructures which have increasing widths and decreasing distances in a defined direction.

7. The optical element of claim 6, wherein the substructures are pillar-shaped or bar-shaped.

8. The optical element of claim 6, wherein the diffraction structures have a smaller grating constant in the second region than in the first region.

9. The optical element of claim 6, comprising an intermediate region arranged between the first region and the second region, said intermediate region comprising at least one binary blazed diffraction structure that is configured such that a diffraction efficiency in the intermediate region lies between a diffraction efficiency in the first region and a diffraction efficiency in the second region.

10. A projection objective for a microlithographic projection exposure apparatus, comprising the optical element of claim 6.

* * * * *